(12) United States Patent
Owa

(10) Patent No.: US 6,324,203 B1
(45) Date of Patent: Nov. 27, 2001

(54) LASER LIGHT SOURCE, ILLUMINATING OPTICAL DEVICE, AND EXPOSURE DEVICE

(75) Inventor: Soichi Owa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/096,674

(22) Filed: Jun. 12, 1998

(30) Foreign Application Priority Data

Jun. 13, 1997 (JP) .................................................. 9-156450
Mar. 4, 1998 (JP) .................................................. 10-051999

(51) Int. Cl.[7] ........................ H01S 03/094; H01S 03/093
(52) U.S. Cl. .............................. 372/75; 372/68; 372/72; 372/97; 372/106
(58) Field of Search .............................. 372/68, 70–72, 372/75, 97, 106; 369/112

(56) References Cited

U.S. PATENT DOCUMENTS

| | | | |
|---|---|---|---|
| 5,412,678 | * | 5/1995 | Treat et al. .............................. 372/45 |
| 5,617,441 | * | 4/1997 | Nakata et al. .......................... 372/70 |
| 5,822,292 | * | 10/1998 | Akutsu et al. ........................ 369/112 |

OTHER PUBLICATIONS

Asai, Hanyu, and Takikawa, Resolution Limit for Optical Lithography Using Polarized Light Illumination, Jpn. J. Appl. Phys., vol. 32, Part 1, No. 12B pp. 5863–5866 (1993) Dec.

U.S. application No. 08/657,910, Owa, filed Jun. 7, 1996.

* cited by examiner

Primary Examiner—Teresa M. Arroyo
Assistant Examiner—James Menefee
(74) Attorney, Agent, or Firm—Ipsolon LLP

(57) ABSTRACT

A light source for an exposure device associated with an optical lithographic system is disclosed. The light source includes a structural body having slots for receiving a plurality of laser elements. The laser elements are modular. Thus, they can be removed and installed separately, which facilitates ease of maintenance. The laser elements have a semiconductor laser that pumps a solid-state laser that is subjected to nonlinear optical crystals that convert the laser beam to smaller wavelength light to produce polarized UV laser light for use in optical lithography. The laser light from each laser element is linearly polarized. The laser elements are located in the structural body in different orientations so as to orient their respective directions of polarization different from each other so as to prevent dissimilar line widths of linear features of lithographically produced substrates that use laser light sources.

22 Claims, 4 Drawing Sheets

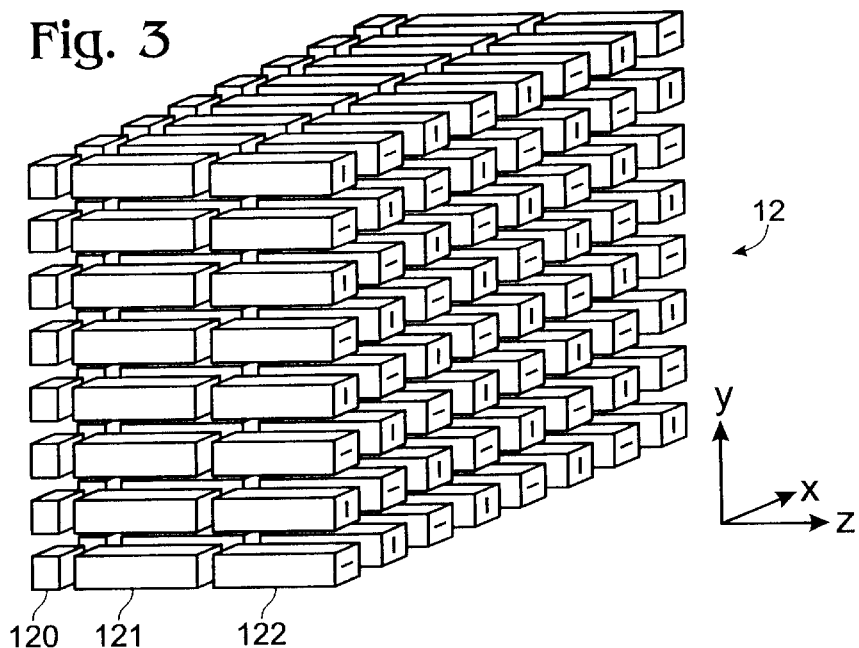
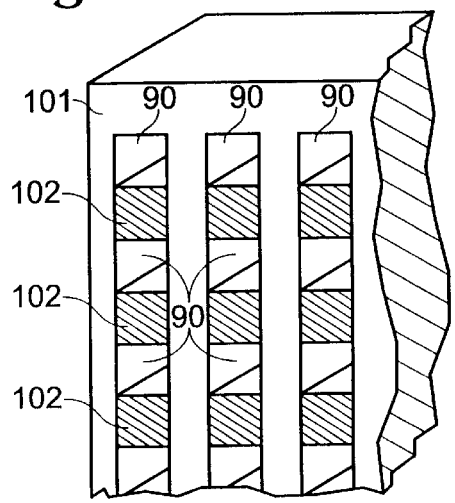
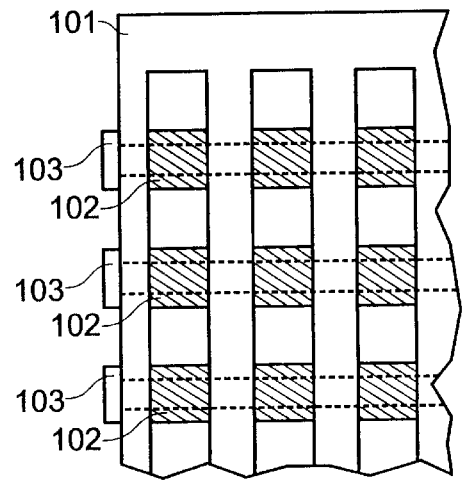
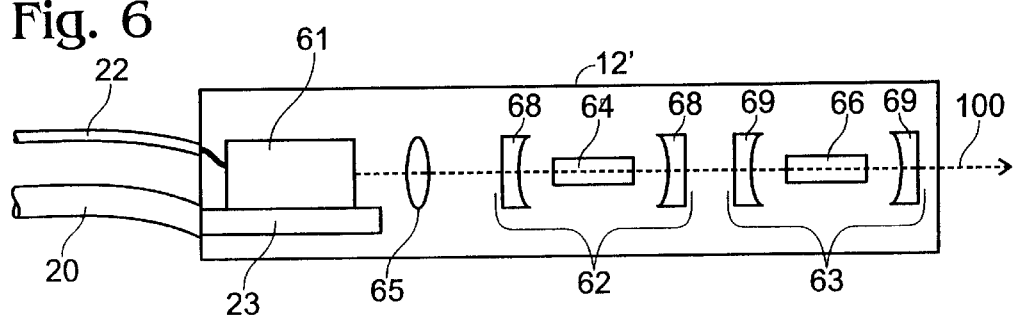

LASER LIGHT SOURCE, ILLUMINATING OPTICAL DEVICE, AND EXPOSURE DEVICE

BACKGROUND OF THE INVENTION

1. Field of the Invention

This invention pertains to a light source for a lithographic device for use in semiconductor manufacturing operations. More particularly, the invention pertains to an array of small lasers as the light source for a lithographic exposure device for use in manufacturing semiconductors.

2. Description of the Related Art

Semiconductor fabricators are motivated to increase semiconductor performance and reduce manufacturing costs, factors that are greatly affected by the semiconductor fabrication process. Optical lithography is a preferred fabrication process for producing semiconductors. An optical lithographic system includes an exposure device, a mask, and resist.

Semiconductor performance is affected by the size of the circuits on the substrate. Thus, a goal in semiconductor fabrication is to create a small feature size, that is, a minimum size of an object formed on a semiconductor substrate. The minimum feature size that can be fabricated by an optical lithographic process is proportional to the wavelength of the light source of the exposure device. Previous optical lithographic systems used light from a mercury lamp light source having a wavelength of 436 to 365 nm. Currently, there is much research to optimize optical lithographic systems using a laser light source having wavelengths less than 250 nm in order to create a smaller minimum feature size.

While lasers can produce light energy having a short wavelength, other problems occur when a laser light source is used to project a mask pattern onto a substrate.

When a linearly polarized laser light source illuminates a mask pattern having linear portions, the width of linear portions oriented parallel to the direction of linear polarization will be different than the width of linear portions that are oriented orthogonally to the direction of the laser polarization. This is a disadvantage. The analysis and experimental results concerning this problem are described by Asai et al. (S. Asai, I. Hawyu, and M. Takikawa, Resolution Limit for Optical Lithography Using Polarized Light Illumination, Jpn. J. Appl. Phys., Vol. 32, 1993, pp. 5863-5866.)

As noted, early exposure devices used a mercury lamp as the light source. The mercury lamp light is nonpolarized, thus the line widths of the semiconductor features were uniform regardless of the orientation of the linear features of the mask.

An exposure device using a UV laser generates polarized light. In order to solve the aforementioned problem of varying line widths, prior art laser exposure devices used a birefringent optical element to make the overall light output from the light source nonpolarized. However, the birefringent element reduces the available power from the laser light source to the substrate.

A prior reference discloses a low-coherence laser light source having a plurality of miniature UV lasers in a bundle that is used as a UV light source for the exposure device.

For the laser light source which has a plurality of UV lasers set as a bundle, the outputs of the various UV lasers are linearly polarized. However, as described in the aforementioned reference, they do not interfere with each other, because they have low coherence. Consequently, because the laser beams emitted from the various lasers overlap, it is possible to obtain a light source for which the illumination becomes uniform, and the coherence level is lowered so that speckling is alleviated.

However, when the laser beams emitted by the plurality of lasers overlap, if all of the polarization directions of the laser beams are the same, the polarization direction of the overlapping illuminating light becomes linearly polarized light, and the aforementioned problem occurs wherein lines having different orientations have different line width on the substrate.

SUMMARY OF THE INVENTION

The purpose of this invention is to provide a laser light source having a plurality of lasers arranged side by side and oriented relative to each other so as to provide a nonpolarized, incoherent light source.

The present invention provides a light source for an exposure device that produces consistent feature line width on a substrate regardless of line orientation.

The present invention provides a laser light source comprising a plurality of laser elements. Some of the laser elements are oriented to produce laser beams having a first polarization direction and other laser elements are oriented to produce laser beams having a second polarization direction that is different from the first polarization direction. Thus, for linear polarization, if the first direction of polarization is oriented at zero degrees from a reference plane, the second polarization direction is oriented at an angle other than zero or 180 degrees from the same reference plane. Similarly, if the first direction of polarization is counterclockwise circular or elliptical polarization, the second direction of polarization may be clockwise circular or elliptical polarization.

In a preferred embodiment, half the laser elements are oriented to provide the laser beams having the first polarization direction and the remaining laser elements are oriented to produce laser beams having the second polarization direction. Preferably, where the beams are linearly polarized, the first polarization direction is orthogonal to the second polarization direction. Thus, the various laser elements that form the laser light source are set to have different polarization directions, and, as an overall light source, the resulting laser beam is nonpolarized.

In this specification, the nonpolarized state refers to the state in which a plurality of photons having no interference with each other have polarization directions different from each other.

BRIEF DESCRIPTION OF THE FIGURES

FIG. 3 is a perspective view of an alternative embodiment of the present invention, shown without a structural body to better illustrate some features.

FIG. 4 is a partial perspective view of a structural body for supporting lasers elements of the light source of the present invention.

FIG. 5 is a partial elevation view of the structural body.

FIG. 6 is a cross-sectional view of an alternative embodiment of a laser element of the light source of the present invention.

DESCRIPTION OF THE PREFERRED EMBODIMENTS

Figure 8:
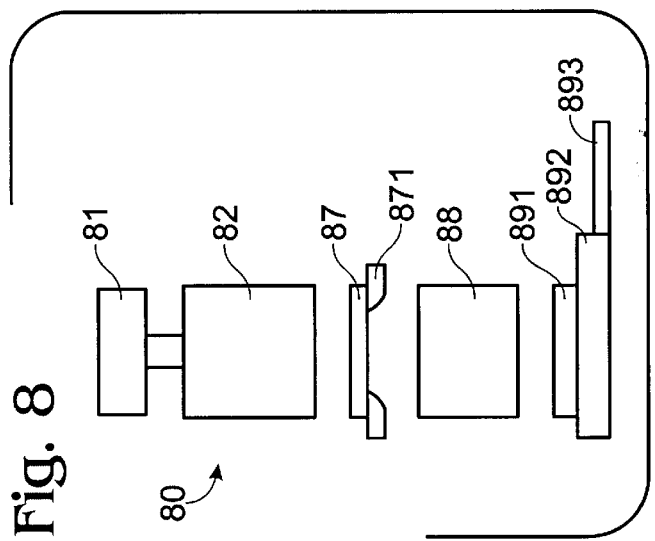
FIG. 8 is a schematic representation of an exposure device using a laser light source of the present invention.

A projecting exposure device 80 using a laser light source 81 of the present invention will be explained with reference to FIG. 8.

The projecting exposure device 80 uses the laser light source 81 having a plurality of laser elements (not separately shown in FIG. 8) generating UV pulsed laser beams. There is no limitation on the number of laser elements contained in the laser light source 81. The cross-sectional area and number of the individual lasers are determined such that the illuminating surface of the overall laser light source 81 formed by the plurality of lasers is of an appropriate size to match the optical system of the exposure device.

The projecting exposure device 80 also includes an illumination optical system 82 for uniformly illuminating a mask 87 with laser light from the light source 81. A mask support unit 871 supports the mask 87, which has an exposure pattern depicted on it. Projection lens 88 images the mask pattern onto semiconductor substrate (or wafer) 891, which is carried on moving stage 892. Moving stage 892 can be moved by means of a stage driving unit 893.

The image of the circuit pattern on mask 87 is projected onto semiconductor substrate 891 by light passing through projection lens 88. The image is demagnified by a desired demagnification when projected onto semiconductor substrate 891. In the present invention, the laser light emitted from light source 81 is in the non-polarized state, as explained below. Consequently, all portions of the mask pattern can be projected onto substrate 891 correctly and with uniform line width, regardless of the orientation direction of mask patterns, i.e., whether a mask line is parallel or orthogonal to the direction of polarization.

By moving the stage 892, a step-and-repeat process is performed. A movement mechanism (not shown) for movement of mask 87 is set in mask support unit 871. In this way, scanning exposure is carried out by means of movement in synchronization with the mask.

A first preferred embodiment of the laser light source 81 of the present invention will now be explained with reference to FIGS. 1–3.

Figure 1:
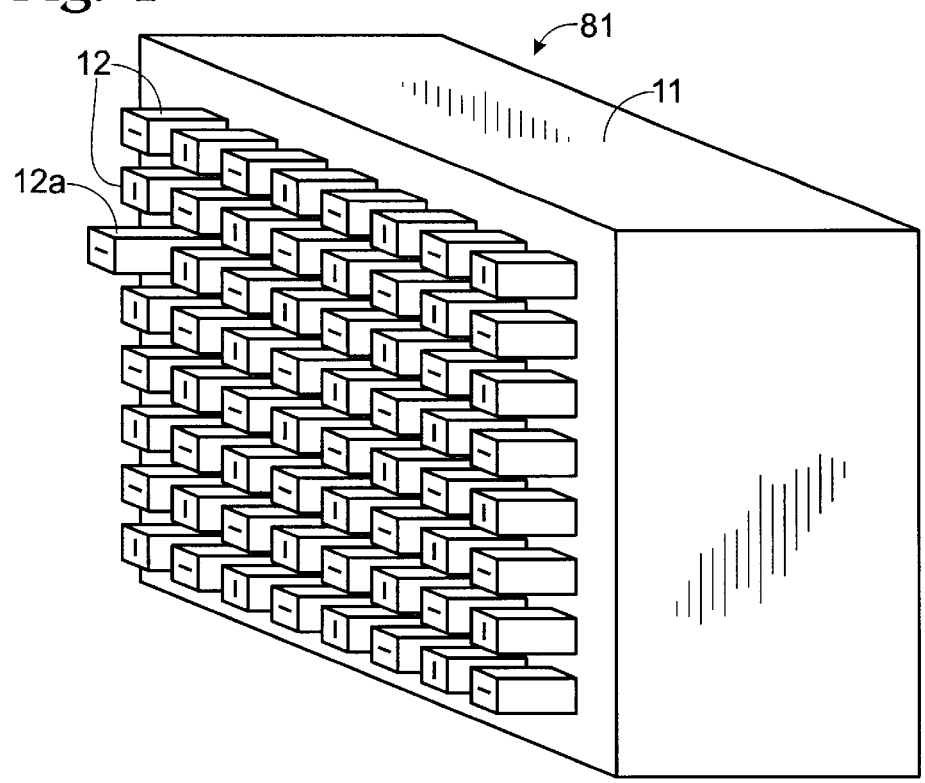
FIG. 1 is a perspective view of a first embodiment of a laser light source of the present invention and including a diagrammatic representation of preferred directions of laser polarization.

FIG. 1 shows the laser light source 81 having a structural body 11 that support an array of laser elements 12. In this embodiment, the array is depicted as a square array having eight columns and eight rows of laser elements 12, thus providing sixty-four laser elements. Other embodiments could comprise greater or fewer laser elements.

Each element 12 has an output aperture 14 (FIG. 2) at an end 16 for output of a laser beam 100. A power source (not shown) connects to cables 21 and 22, located at an end 18 for providing electrical power to the laser element. A pipe 20 is provided for feeding cooling water to a cooling channel 23 to cool laser element components. Output apertures 14, cables 21, 22, and cooling pipes 20 are omitted in FIGS. 1 and 3 for clarity.

Preferably, laser element 12 has a substantially square cross-sectional shape with approximate dimensions of 2 cm×2 cm, and a length of about 20 cm. However, the cross-sectional shape of the elements 12 is not limited to the square shape. For example, the cross-section may be rectangular or circular.

Structural body 11 includes a plurality of through-holes, or slots 90 (FIG. 4), that support laser elements 12. The present embodiment provides an array of slots 90 having eight rows and eight columns, for a total of sixty-four slots for the sixty-four laser elements. A laser element 12 is inserted in a slot 90 until the element reaches a predetermined position. The outer shape of element 12 corresponds to the inner shape of the slot 90 formed in the structural body 11. Laser element flange 701 (FIG. 2), or other positioning structure, is preferably formed on element 12 to provide a stop at the predetermined position as the element is inserted into a slot 90 of body 11.

The lasers have nearly the same output power and generate nearly the same wavelength, yet they do not interfere with each other. In order to obtain lasers free of interference and having substantially the same wavelength, the lasers are formed as pulsed, Q-switched lasers. Injection seeding is performed from a single seed laser to produce lasers for the plurality of laser elements to insure that each generates the same wavelength. In the present invention, the pulse generation timing is shifted from one laser element to the next so that the pulses of the pulsed lasers do not overlap each other, thus providing low spatial coherence.

Figure 2:
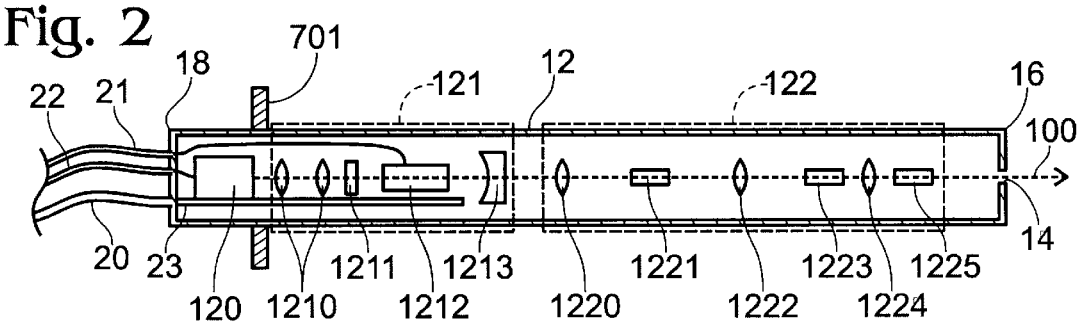
FIG. 2 is a cross-sectional view of a laser element of the present invention.

With reference to FIG. 2, a preferred embodiment of laser element 12 includes a semiconductor laser 120, solid-state laser unit 121 and wavelength conversion unit 122 to produce a UV, pulsed, linearly-polarized laser beam 100.

The semiconductor laser 120 comprises a laser diode unit. Preferably, laser 120 is a GaAIAs laser diode.

The solid-state laser unit 121 includes a pumping optical system 1210, a laser crystal 1211, a modulator (Q-switch) 1212, and a concave mirror 1213. A preferred laser crystal is Nd:YVO4 though other laser crystals may also be suitable.

Lenses 1220, 1222, and 1224 form the wavelength conversion unit 122 along with nonlinear optical crystals 1221, 1223, and 1225.

These optical components are fixedly held in element 12 by such means as soldering to insure high precision of alignment and position.

Light having a 809 nm wavelength is emitted from semiconductor laser 120 and guided by pumping optical system 1210 to laser crystal 1211. Laser crystal 1211 is thus pumped and emits light having a wavelength of 1064 nm. The left end surface of laser crystal 1211 is provided with a coating (not shown) that transmits 809 nm wavelength light but is highly reflective to 1064 nm wavelength laser light so that a laser resonator is formed between this high reflection coating and the inner surface of concave mirror 1213. Q-switch 1212, which works on the acousto-optical effect, is set inside the laser resonator, and the laser oscillation occurs in pulse form.

The pulse light of the fundamental wave (1064 nm) emitted from the solid-state laser 121 is focussed by lens 1220, and is partially converted by first nonlinear optical crystal 1221 (preferably a LBO crystal) to a second harmonic light having a wavelength of 532 nm. After passing through lens 1222, the 523 nm wavelength light is converted to a fourth harmonic wave having a 266 nm wavelength by means of second nonlinear optical crystal 1223 (preferably a BBO crystal). The remaining light of the fundamental wave having a 1064 nm wavelength that was not converted by nonlinear optical crystal 1221 passes through nonlinear optical crystals 1221 and 1223.

After passing through lens 1224 for beam shaping, the sum frequency wave of the fundamental wave (1064 nm) and the fourth harmonic (266 nm) is generated by the third nonlinear optical crystal 1225 (preferably a BBO crystal) as the fifth harmonic (213 nm), which is then emitted as beam 100.

Laser beam 100 is linearly polarized, meaning that the orientation of the laser beam's electric field is constant along the axis of propagation.

The optical components, semiconductor laser 120, solid-state laser unit 121 and wavelength conversion unit 122 are located in element 12. Preferably, the body of element 12 is aluminum alloy, although other materials may also be suitable.

A DC power source connects to cable 21 to provide power to semiconductor laser 120. A power source likewise connects to cable 22 to provide a driving current for the modulator (Q-switch) 1212.

Preferably, a Peltier element (not shown in the figure) is included in laser element 12 for adjusting the temperature of semiconductor laser 120 and laser crystal 1211.

Because the light source 81 has discrete laser elements 12 mounted in structural body 11, maintenance tasks are greatly simplified. It is possible to take out one laser at a time. Thus, if one laser becomes defective, the defective laser can be replaced without disturbing the operating laser elements.

In the embodiment discussed above and shown in FIGS. 1–3, the nonlinear optical crystal 1221 is located in a respective element 12. However, depending on the lifetimes of the various components used in the lasers, it may be desirable to locate the nonlinear optical crystal in a separate housing.

An alternative embodiment of the laser elements 12 is shown in FIG. 3. Semiconductor laser 120, solid-state laser unit 121, and wavelength conversion unit 122 are divided from each other and located in separate housings. Alternatively, it is possible to locate lens 1220, lens 1222, lens 1224, as well as nonlinear optical crystal 1221, 1223, and wavelength conversion crystal 1225 in one housing, and to locate semiconductor laser 120, pumping optical system 1210, laser crystal 1211, Q-switch 1212, and concave mirror 1213 in another housing, rather than the three housings shown in FIG. 3.

During use, if a nonlinear optical crystal 1221, 1223 or wavelength conversion crystal 1225 are damaged, it is necessary to only replace the part having the nonlinear optical crystals and the wavelength conversion crystal alone. This facilitates ease of maintenance.

In an alternative embodiment of the laser element 12, a semiconductor laser and a nonlinear optical crystal are combined to produce UV light. With reference to FIG. 6, an alternate element 12' is shown with semiconductor laser 61, first wavelength conversion unit 62 and second wavelength conversion unit 63.

First wavelength conversion unit 62 is equipped with a nonlinear optical crystal 64 (preferably an LBO crystal) in a resonator formed by opposing concave mirrors 68. Second wavelength conversion unit 63 is likewise equipped with a nonlinear optical crystal 66 (preferably a BBO crystal) in a resonator formed by opposing concave mirrors 69.

In this configuration, light having a wavelength of 840 nm is emitted from semiconductor laser 61, focused by a lens 65, converted by first wavelength conversion unit 62 to light at a wavelength of 420 nm, which in turn is converted by second wavelength conversion unit 63 to light at a wavelength of 210 nm. In this way, polarized UV laser beam 100 is produced.

Figure 7:
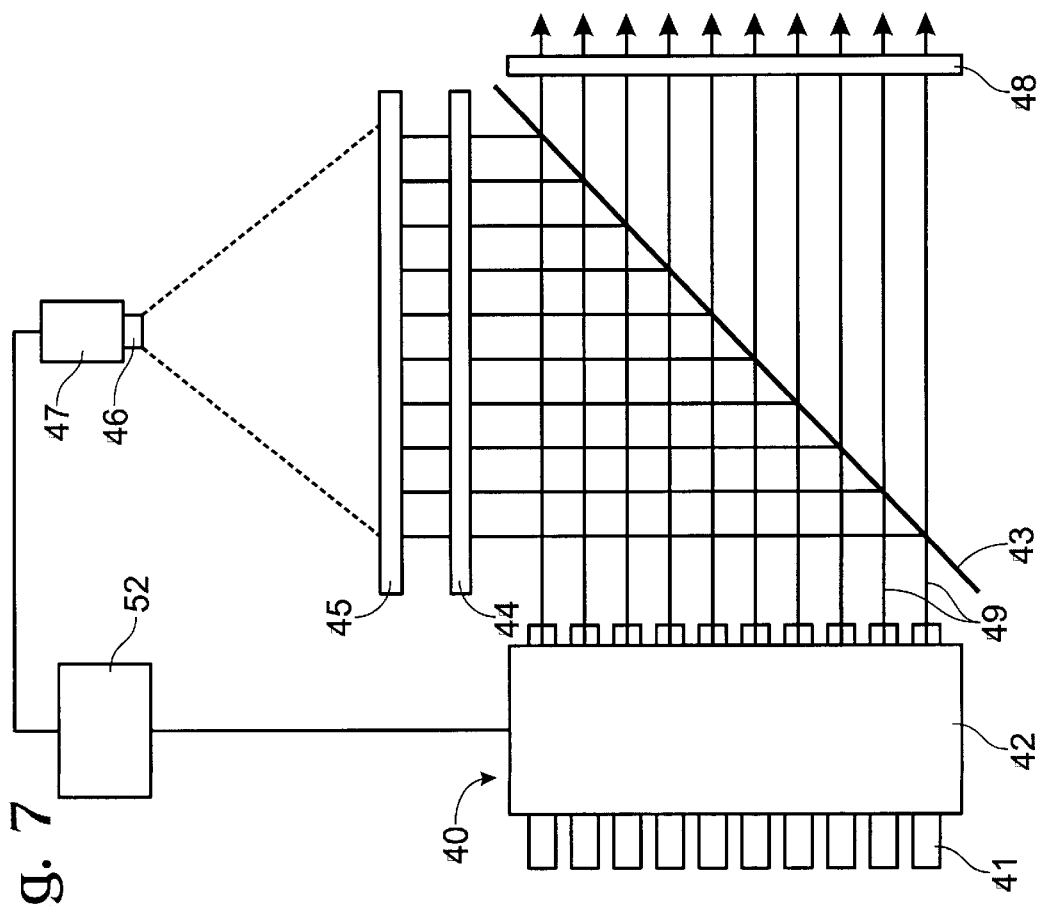
FIG. 7 is an alternative embodiment of a schematic representation of the laser light source of the present invention.

An alternative embodiment of an exposure device of the present invention is shown in FIG. 7 wherein a laser light source 40 includes a monitor mechanism 50 which monitors the laser beams emitted from the various lasers so as to identify a laser that may require service or adjustment or to adjust laser power to compensate for a defective laser. The monitor mechanism 50 includes a beam splitter 43, a wavelength selection filter 44, a diffuser plate 45, an imaging lens 46, a camera 47, and a wavelength selection filter 48.

The laser light source 40 of this embodiment includes a structural body 42 having a plurality of slots for supporting and positioning laser elements 41. The laser elements 41 and structural body 42, may be substantially similar to laser elements 12 and structural body 11 in the previous embodiment. In this embodiment structural body 42 accommodates a total of 100 lasers 41 in a square array of ten columns and ten rows. FIG. 7 is a side view and shows only 10 lasers set side-by-side.

An output beam 49 of each laser contains portions of the fundamental wave (1064 nm), second harmonic wave (532 nm), fourth harmonic wave (266 nm), and fifth harmonic wave (213 nm). A portion (about 0.5%) of these beams 49 is reflected upward by beam splitter 43. The remaining light passes through the beam splitter and strikes filter 48 that passes only the fifth harmonic wave, which is made available to illuminate a mask and substrate in an optical lithographic process.

Beam splitter 43 may be made of a single optical plate to cover a plurality of beams, or it may consist of a small optical beam splitter for each laser.

The light reflected upward by beam splitter 43 goes to wavelength selection filter 44. The filter 44 may be selected to transmit specific wavelengths. Thus, the filter is selected so that only one or several wavelengths among the fundamental through quintuple waves pass through the filter to the diffuser plate 45. Preferably, filter 44 is selected to pass the fundamental wave and the double wave.

Diffuser plate 45 is prepared by grinding one surface (the upper surface) of a glass panel made of BK7, sold by the Schott Corporation. Diffuser plate 45 diffuses the fundamental wave (1064 nm) and second harmonic wave (532 nm). It diffuses each laser beam so that the laser beam becomes a spot-like image to enable camera 47 to take pictures. From the brightness of the spot picked up by camera 47, the laser output power of the fundamental wave or second harmonic wave is measured. As mentioned, the measured wavelength can be selected by filter 44.

Lens 46 is focused on the surface of diffuser plate 45. Camera 47 is a charged-coupled camera (CCD) that can detect light along the spectrum from visible light to 1064 nm wavelength. Lens 46 allows light in the spectral range from visible light to 1064 nm to pass, and its aberration is corrected.

For the fourth harmonic wave (266 nm) and fifth harmonic wave (213 nm), diffuser plate 45 acts as a fluorescent screen that can absorb the UV laser light and emits visible fluorescence. For both the fourth harmonic wave and fifth harmonic wave, the output power is measured based on the fluorescent intensity and the image detected by camera 47.

Filter 44 may be automatically exchanged to permit and observing the output power at each wavelength. Thus, the output power of each of the 100 lasers is measured and the state of operation of each laser can be monitored. When the output power of the fundamental wave is abnormally low, it is estimated that the laser portion that generates the fundamental wave (including the laser diodes for pumping) is abnormal. Also, when the fundamental wave is normal while the second harmonic wave is abnormal, it is estimated that an abnormality occurs in the second harmonic wave generation portion. Similarly, it is possible to discover any abnormality in the portions that generate the fourth harmonic wave and fifth harmonic wave.

In this embodiment, it is possible to determine the abnormal state of lasers and the portions responsible for the abnormality while operating the 100 lasers in the array.

As explained above, once an abnormal laser is identified, the laser can be pulled out of the structural body 11 for replacement or service without affecting the remaining lasers (they may remain in operation).

When one laser is pulled out, the overall light intensity of the light source decreases by 1%. The light source may be kept operating at full capacity by raising the output power of the other lasers by 1%. Alternatively, a decrease in output power due to one defective laser can be compensated by prolonging the exposure time by 1% for the exposure device.

The output of the CCD can be provided to a control mechanism 52 for controlling power to the lasers. Thus, when the system detects that a laser is defective and producing no light energy, the power to the operational lasers may by increased to compensate for the defective laser. This compensation permits the exposure device to continue operations until the defective laser is serviced or replaced. Alternatively, the CCD output could be used to control the time of exposure of laser light to expose a substrate with resist. Thus, if the monitor detects a defective laser, the exposure time may be increased to compensate for the reduced power from the laser array. In addition, the control mechanism 52 may use both techniques to compensate for a defective laser.

The monitoring mechanism 50 of this embodiment (FIG. 7) can be removable so that it is installed and operates on the laser light source only when needed to test the laser elements.

Figure 9:
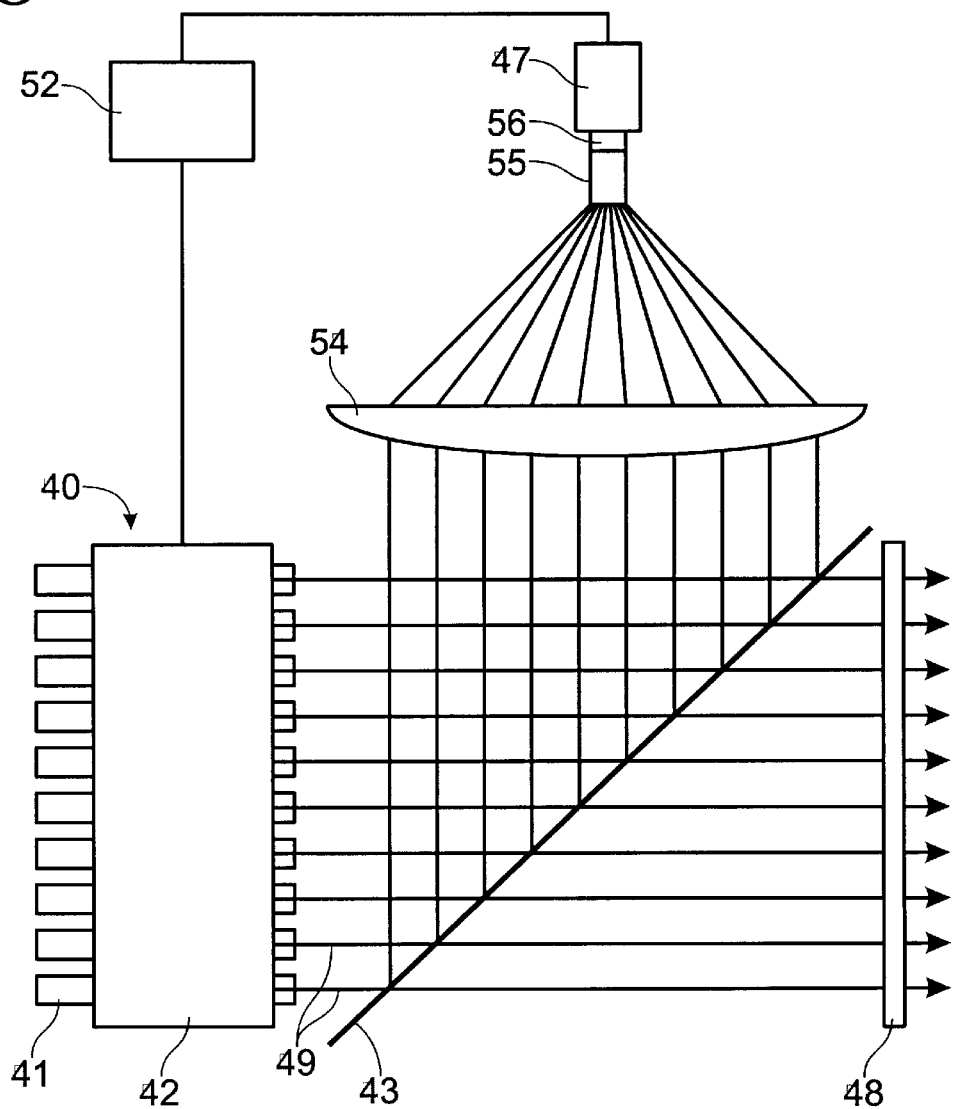
FIG. 9 is an alternative embodiment of a schematic representation of the laser light source of the present invention.

In a similar embodiment, shown in FIG. 9, lens 54, beam observation unit 55, and imaging lens 56 are used in place of wavelength selection filter 44, screen 45, and imaging lens 46.

In this embodiment, the light reflected upward by beam splitter 43 is focused by condensing lens 54 onto beam observation unit 55 and imaging lens 56. Contained inside beam observation unit 55 is a tunable, wavelength-selection filter (not shown), that operates similarly to wavelength selection filter 44 and screen 45. This filter acts as a diffusing plate for the fundamental wave and the second harmonic wave, and acts as a fluorescent plate for the fourth harmonic and fifth harmonic waves.

The diffused light and fluorescent light generated by the screen of beam observation unit 55 are imaged by imaging lens 56, and are converted to electric signals by pick-up camera 47. By means of this signal, the output power at each wavelength of each laser is measured, and the operation state and any abnormal site of each laser 41 are monitored.

In the aforementioned embodiments, a defective laser can be identified together with the information about the abnormal portion, so that its exchange, service, or other maintenance can be carried out easily.

Next, an example of the manufacturing method of the structural body 11 is explained with reference to FIGS. 4 and 5.

First, a block of aluminum alloy is prepared to form main body 101 that is compatible with the exposure device to which it will be attached. Then, through-grooves 100 are formed in the body, the grooves having widths corresponding to the size of the laser elements 12. FIG. 4 is a diagram illustrating three of the grooves 100.

Then, aluminum rod-shaped members 102 are inserted into the grooves 100 at intervals corresponding with the laser element size and arranged such that the shape of the spaces are identical to the cross-sectional shape of elements 12.

Thereafter, a hole is drilled orthogonal to the surface of main body 101 through for insertion of rod-like members 102 and main body 101 of the structural body. Then, fasteners 103 are inserted into the through-holes so as to attach rod-like members 102 to main body 101. FIG. 5 is a front view showing rod-like members 102 is attached by fasteners 103.

Elements 12 are inserted into structural body 11. It is preferred that a position adjustment mechanism be provided to ensure that element 12 is inserted in a desired position in the slot and is held firmly. As explained above with reference to FIG. 2, flange 701, formed on element 12, acts as this position adjustment mechanism. Element 12 is inserted into the slot until the flange 701 contacts structural body 11. In this way, it is possible to position the tip of element 12 at the desired position.

Because these components are precision components and must be treated with care, it is desirable to prevent scratching of the laser elements and the structural body 11. Thus, to reduce the opportunity for scratching, one member is made of a softer material than the other member. Alternatively, a low-friction coating may be applied to one member.

There is no specific limitation on the configuration of structural body 11. It may be block shape as shown in FIG. 1, or other configuration. It is only necessary that the block have sufficient strength to safely support the laser elements and properly mount to the exposure device. There is no special limitation on the specific structural parts of body 11, so long as sufficient strength and stability for holding and accommodating the various lasers is obtained.

In this embodiment, when maintenance must be performed, it is possible to pull individual element 12 from the rear side. FIG. 1 illustrates the state when one piece 12a of element 12 is pulled out midway.

The shape of the slots formed on structural body 11 correspond to the outer shape of laser elements 12. For example, as shown in FIG. 1, when all elements 12 have the same square cross-section, the slots in body 11 must have a corresponding cross-sectional shape.

Laser elements 12 are inserted into the slots 90 of the body 11. When square cross-section elements are used, each element can be inserted into the body so as to provide one of two orientations for its respective polarized beam. Preferably, alternate elements 12 are oriented 90° relative to each other so that their respective linearly polarized beams are substantially orthogonal to each other. Thus, when all of the lasers emit linearly polarized laser beams, it is possible to obtain a laser light source that emits nonpolarized laser light by changing the polarization direction of half or some of the lasers by 90°. This configuration is represented in FIG. 1, wherein the directions of polarization are represented by lines on the ends of the laser elements 12.

When the light source of the present invention is used in an optical lithographic process, the line widths formed by line patterns parallel to the polarization direction and line patterns orthogonal to the polarization direction are the same width.

Any combination of directions of polarization are acceptable as long as substantially half of the lasers have one polarization direction and the other half of the lasers are oriented to provide a different polarization direction. Preferably, the overall spatial distribution is uniform.

The polarization directions are not limited to two directions. Laser elements may be oriented to provide laser beams having other polarization directions, different from the other two directions. To provide a greater number of polarization directions it may be necessary to have elements with non-square cross-sections. The cross-sectional shape of the elements may be polygonal, circular, or other suitable shape that can provide multiple options for orienting the elements in the body 11. When the elements have a polygonal shape, it is preferred that they be inserted randomly into the slots 90 so that the polarization directions are randomly distributed. When the elements have a circular cross-sectional shape, it is acceptable to form positioning grooves or keys on the elements, and to form the corresponding ridges or keyways randomly on the side surfaces of the slots.

As explained above, in order to obtain different polarization directions, the orientations of the lasers in the elements are selected to be different (rotary with respect to the axis at the center). However, it is also possible to set a birefringent optical element at the output end of each laser of the element of the laser, or to set a single birefringent optical element to cover the entire output light of the various lasers. For the optical elements used in this case, the thickness is different in the regions of passage of light from the various lasers. It is preferred that the crystal axis of the optical elements be about 45° with respect to the polarization direction of the incident light.

Light of different types of polarization may be produced. For example, the light may be circularly or elliptically polarized. If the light from the laser has circular or elliptic polarization, the light from some of the laser elements may have counterclockwise circular or elliptical polarization, and light from the remaining laser elements may have clockwise circular or elliptical polarization. Thus, the laser elements form one light source that is nonpolarized light. Alternatively, some of the light may have linear polarization, and the remaining light elliptical or circular polarization.

This specification describes materials, shapes, configurations, and arrangements of parts for making and using the invention. Such descriptions are provided to teach the best modes of the invention and enable a skilled person to make and use the invention. It is intended that the scope of the patented invention shall be only limited by the language of the claims and the law of the land as pertains to valid U.S. patents.

What is claimed is:

1. An optical lithography laser light source, comprising:
   a first laser element that provides a laser beam having a first direction of polarization; and
   a second laser element coupled to the first laser element, the second laser element providing a laser beam having a second direction of polarization, wherein the first direction of polarization and the second direction of polarization are not the same and the first and second laser elements project light onto a substrate coated with a photosensitive agent to form a pattern on the substrate.

2. The laser light source of claim 1 wherein first and second laser elements provide linearly polarized beams and the first direction of linear polarization is substantially orthogonal to the second direction of linear polarization.

3. The laser light source of claim 1 comprising a plurality of first laser elements that provide a respective plurality of laser beams having the first direction of polarization, and a plurality of second laser elements that provide a respective plurality of laser beams having the second direction of polarization.

4. The laser light of claim 3, wherein the plurality of first and second laser elements emit linearly polarized beams and the plurality of first laser elements is oriented relative to the plurality of second laser elements so that the first direction of linear polarization is not parallel to the second direction of linear polarization.

5. The laser light source of claim 3 wherein the laser light source further comprises a structural body that supports the plurality of first and second laser elements such that the plurality of first laser elements are oriented at a first orientation and the plurality of second laser elements are oriented at a second orientation and wherein the first orientation of the plurality of first laser elements provides the first direction of linear polarization and the second orientation of the plurality of second laser elements provides the second direction of linear polarization.

6. The laser light source of claim 5, wherein the plurality of first and second laser elements are coupled to the structural body and oriented relative to the structural body at the first and second orientations, and wherein a change in the first direction of linear polarization changes the first direction of linear polarization and a change in the second orientation changes the second direction of linear polarization.

7. The laser light source of claim 6, wherein the quantity of first laser elements is substantially equal to the quantity of second laser elements.

8. The laser light source of claim 1, further comprising a monitor that detects radiation intensity of the laser beams emitted from the plurality of light source elements and provides an output indicative of the radiation intensity of the laser beams.

9. The laser light source of claim 8 further comprising an adjustment device that receives the output of the monitor device and adjusts power of the laser beams emitted from the laser elements in response to the detected radiation intensity of the laser beams.

10. The laser light source of claim 1 wherein the first and second laser elements comprise a solid-state laser and a nonlinear optical crystal wherein the nonlinear optical crystal converts light output from the solid-state laser to light having a wavelength in the ultraviolet range of wavelengths.

11. The laser light source of claim 8 further comprising an adjustment, device that receives the output of the monitor device and adjusts a duration of the laser beams emitted from the laser elements in response to the detected radiation intensity of the laser beams.

12. A laser light source, comprising:
    a first laser element that provides a laser beam having a first direction of polarization;
    a second laser element coupled to the first laser element, the second laser element providing a laser beam having a second direction of polarization, wherein the first direction of polarization and the second direction of polarization are not the same; and
    a monitor that detects radiation intensity of the laser beams emitted from the plurality of light source elements and provides an output indicative of the radiation intensity of the laser beams, wherein the monitor includes a charged-coupled-device camera for detecting the brightness of the laser beams emitted form the laser elements.

13. A laser light source, comprising:
- a first laser element that provides a laser beam having a first direction of polarization;
- a second laser element coupled to the first laser element, the second laser element providing a laser beam having a second direction of polarization, wherein the first direction of polarization and the second direction of polarization are not the same; and
- a monitor that detects radiation intensity of the laser beams emitted from the plurality of light source elements and provides an output indicative of the radiation intensity of the laser beams wherein the monitor includes a beam splitter, a diffusing plate and a camera, wherein the beam splitter splits the laser beams so as to reflect a portion of the laser beams to the diffusing plate and the camera detects light intensity on the diffusing plate and provides an output indicative of the light intensity.

14. The laser light source of claim 13 further comprising a wavelength filter located along the light path between the beam splitter and the diffusing plate so as to select a predetermined wavelength of light for transmittance to the diffusing plate, whereby the monitor can detect radiation intensity of a predetermined wavelength of light.

15. A light source, comprising:
- a support body;
- a plurality of first laser elements coupled to the body and producing a plurality of laser beams having a first direction of polarization; and
- a plurality of second laser elements coupled to the body and producing a plurality of laser beams having a second direction of polarization, wherein the first direction of polarization and the second direction of polarization are not the same;
- wherein the plurality of first laser elements and the plurality of second laser elements are arranged in an array of rows and columns such that the laser elements in a row alternate as first laser elements and second laser elements and the laser elements in a column alternate as first laser elements and second laser elements.

16. An optical lithography laser light source, comprising:
- a support body;
- a plurality of laser elements coupled to the body, wherein the plurality of laser elements are individually detachably coupled to the support body; and
- a monitor for detecting light energy emitted from the laser elements and providing an output indicative of the light energy, wherein the monitor includes a beam splitter, a diffusing plate and a light detector, the beam splitter deflecting a portion of the light energy onto the diffusing plate and the light detector detecting the light energy on the diffusing plate.

17. A method of illuminating a photosensitive object via a pattern object having a pattern to impart the pattern onto the photosensitive object, comprising:
- detachably coupling a plurality of laser elements to an element holder, individually detaching an individual laser element from the element holder for replacing or repairing such individual laser element, monitoring light intensity of the laser beams and producing an output signal indicative of the light intensity, and in response to a change in the light intensity, uncoupling a laser element from the element holder and coupling a replacement laser element to the element holder.

18. A method of illuminating a photosensitive object via a pattern object having a pattern to impart the pattern onto the photosensitive object, comprising:
- detachably coupling a plurality of laser elements to an element holder, individually detaching an individual laser element from the element holder for replacing or repairing such individual laser element, monitoring light intensity of the laser beams and producing an output signal indicative of the light intensity, and changing a power of the laser beams in response to the output signal.

19. A method of illuminating a photosensitive object via a pattern object having a pattern to impart the pattern onto the photosensitive object, comprising:
- detachably coupling a plurality of laser elements to an element holder, individually detaching an individual laser element from the element holder for replacing or repairing such individual laser element, monitoring light intensity of the laser beams and producing an output signal indicative of the light intensity, and changing a duration of the laser beams in response to the output signal.

20. A method of illuminating a photosensitive object via a pattern object having a pattern to impart the pattern onto the photosensitive object, comprising:
- detachably coupling a plurality of laser elements to an element holder, individually detaching an individual laser element from the element holder for replacing or repairing such individual laser element, and beam splitting light from the laser elements so as to deflect a portion of the light to enable a light detector to detect an intensity of the deflected light and produce an output signal indicative of the intensity.

21. An exposure apparatus which transfers a pattern on a first object onto a second object, comprising:
- a laser light source of which a plurality of laser elements are coupled to a support body, wherein the plurality of laser elements are individually detachably coupled to the support body; and
- an illumination optical system disposed between the laser light source and the first object to illuminate the first object with light beams emitted from the plurality of laser elements.

22. The apparatus according to claim 21, wherein the laser light source includes a solid-state laser and plurality of nonlinear optical elements to convert light form the solid-state laser to ultraviolet light.

* * * * *